United States Patent [19]

Amelio

[11] 3,931,674

[45] Jan. 13, 1976

[54] SELF ALIGNED CCD ELEMENT INCLUDING TWO LEVELS OF ELECTRODES AND METHOD OF MANUFACTURE THEREFOR

[75] Inventor: Gilbert F. Amelio, Saratoga, Calif.

[73] Assignee: Fairchild Camera and Instrument Corporation, Mountain View, Calif.

[22] Filed: Feb. 8, 1974

[21] Appl. No.: 440,930

[52] U.S. Cl. .................... 29/578; 29/589; 357/24; 357/91
[51] Int. Cl.² ................................ B01J 17/00
[58] Field of Search .......... 29/571, 578, 589, 576 B; 357/24, 91

[56] References Cited
UNITED STATES PATENTS

| | | | |
|---|---|---|---|
| 3,735,156 | 5/1973 | Krambeck | 357/24 |
| 3,745,647 | 7/1973 | Boleky | 29/571 |
| 3,796,928 | 3/1974 | Doo | 357/24 |
| 3,852,799 | 12/1974 | Walden | 357/24 |

*Primary Examiner*—W. Tupman
*Attorney, Agent, or Firm*—Alan H. MacPherson; Norman E. Reitz; J. Ronald Richbourg

[57] ABSTRACT

A self-aligned charge coupled device comprises a semiconductor substrate having implanted barrier regions, an insulation layer disposed over the substrate, a first layer of closely spaced electrodes, a second layer of closely spaced electrodes interlaced between electrodes of the first layer and separated by insulation, and a conductor deposited between the first and second electrodes so as to electrically connect portions of the first electrodes to portions of the second electrodes. The process for fabricating this self-aligned CCD structure comprises the steps of selectively removing portions of a first conducting layer to form the first electrodes, forming a first oxide layer over the first electrodes, implanting barrier regions in the substrate in alignment with edges of the first oxide layer, selectively removing portions of a second conducting layer to form the second electrodes between the electrodes of the first electrode layer, forming a second oxide layer over the entire structure, selectively removing portions of the first and second oxide layers, and depositing conductors over the structure to electrically connect portions of the first electrodes to portions of adjacent second electrodes. Another disclosed embodiment relates to an alternate method of fabricating a semiconductor structure having closely spaced electrodes. The disclosed method is modified to remove portions of the first insulation layer prior to forming the second conducting layer so that each of the first electrodes are formed in ohmic contact with corresponding adjacent ones of the second electrodes.

9 Claims, 13 Drawing Figures

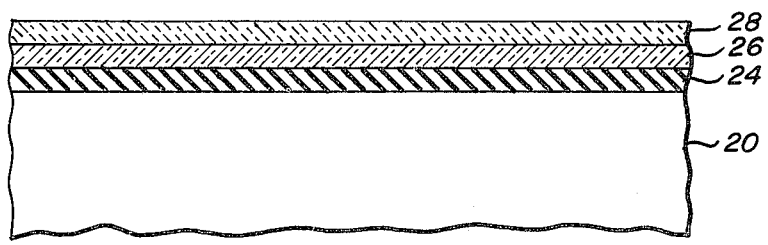
Fig_1
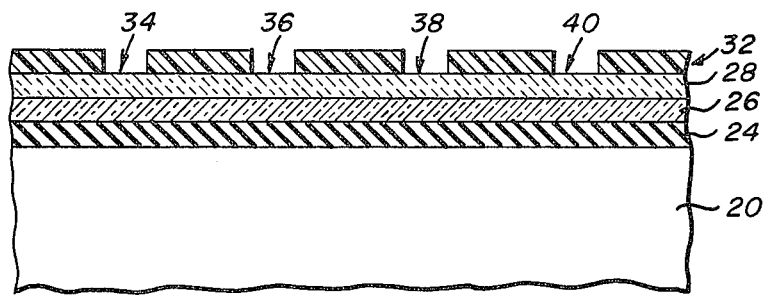
Fig_2
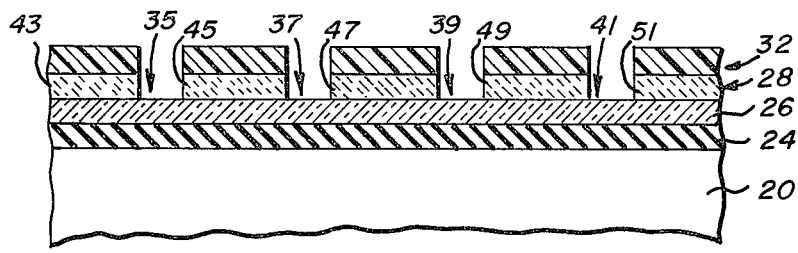
Fig_3
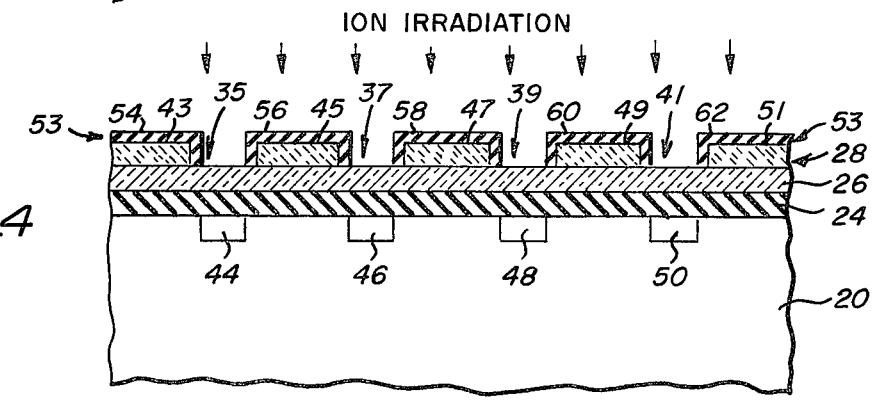
Fig_4
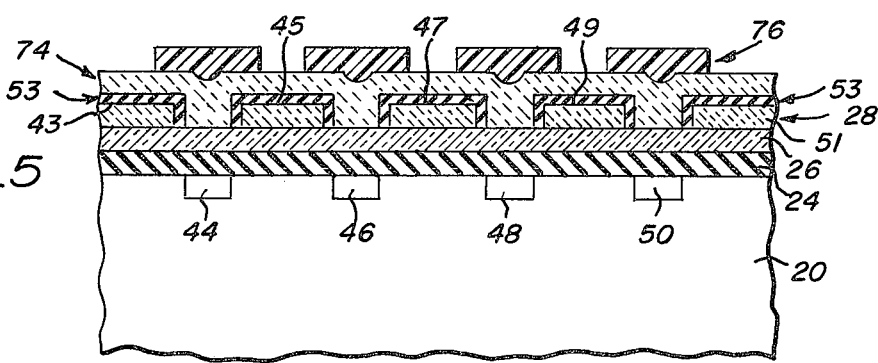
Fig_5

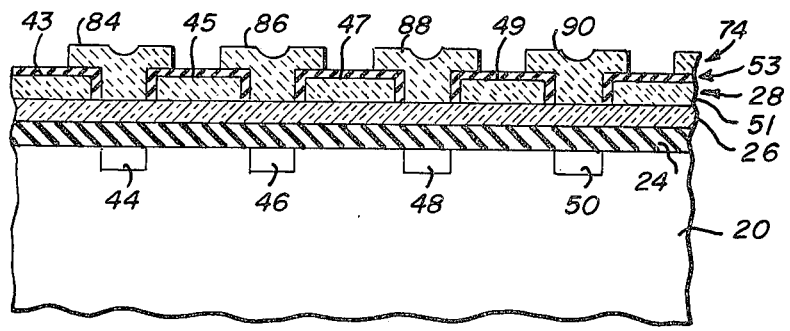
Fig_6
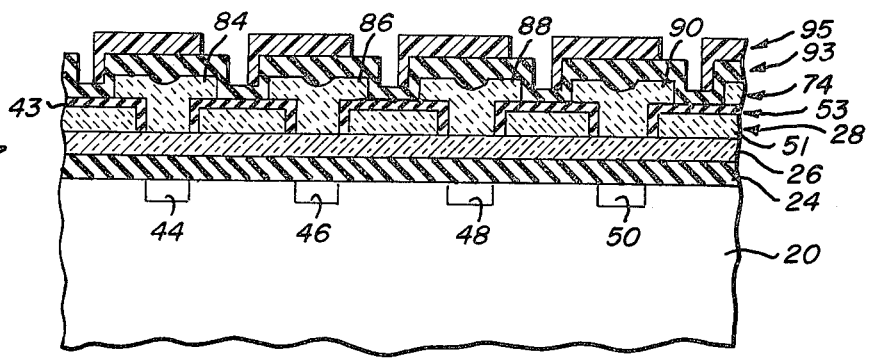
Fig_7
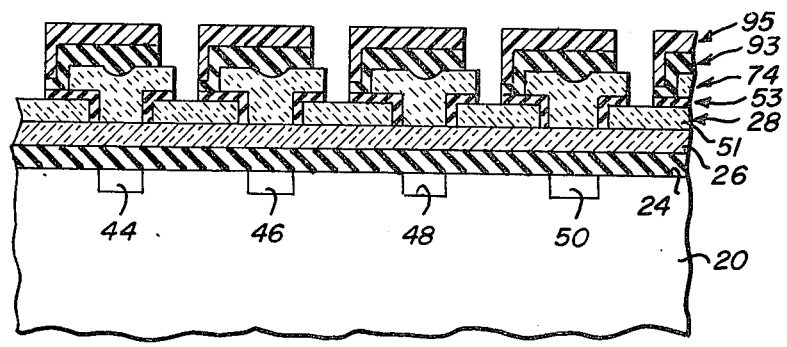
Fig_8
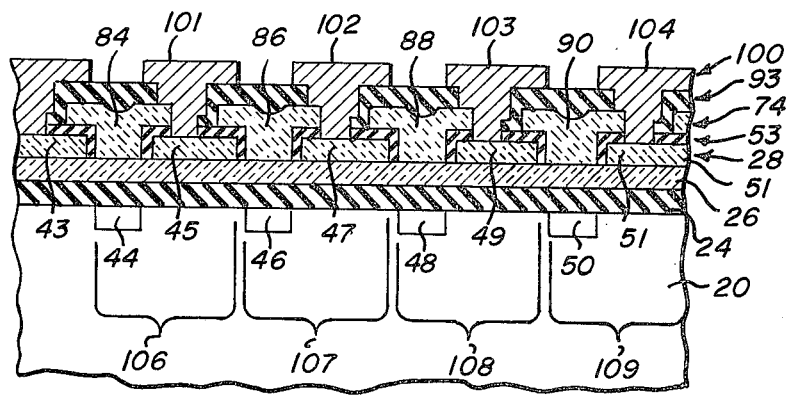
Fig_9

SELF ALIGNED CCD ELEMENT INCLUDING TWO LEVELS OF ELECTRODES AND METHOD OF MANUFACTURE THEREFOR

BACKGROUND OF THE INVENTION

1. Field of the Invention

This invention relates to a charge coupled semiconductor device and the method of manufacture therefor; and, more particularly, to a charge coupled device (hereinafter CCD) having two levels of gate electrodes and self-aligned implanted barriers.

2. Description of the Prior Art

W. S. Boyle and G. E. Smith describe the basic concept of charge coupled semiconductor devices in an article published in the Apr. 19, 1970 *Bell System Technical Journal*, page 587, entitled "Charge Coupled Semiconductor Devices." As described by Boyle and Smith, a charge coupled device consists of a metal-insulation-semiconductor (MIS) structure in which minority carriers are stored in a "spatially defined depletion region," also called "potential well" at the surface of the semiconductor material. The charge is moved along the surface by moving the potential minimum. A paper on page 593 of the same volume of the *Bell System Technical Journal* by Amelio, et al., entitled "Experimental Verification of the Charge Coupled Device Concept" described experiments carried out to demonstrate feasibility of the charge coupled device concept.

As discussed by Boyle and Smith, charge coupled devices are potentially useful as shift registers, delay lines, and in two dimensions, as imaging devices or display devices.

A CCD structure comprises a multiplicity of potential wells within a semiconductor substrate. The potential well is employed for storing, or accumulating, packets of charge. The accumulated packets of charge comprise carriers which are minority in relation to the conductivity type of the predominant impurity in the substrate containing the potential wells. In one embodiment, barriers are implanted periodically in the surface of the substrate in intervals which define the lateral extremities of the potential wells. The barriers make possible unidirectional flow of the charge packets. In some prior art CCD structures, the size of the implanted barriers, and the size of the potential well between adjacent barriers varies. This restricts the charge handling capabilities and the packing density of the CCD structure.

A need existed to develop a process and a CCD structure that would have self alignment features which would permit the gate electrodes of the two phase CCD to be in substantial self alignment with the implanted barrier regions cooperatively coupled to the overlying gate electrodes. Also, a need existed for a process and a resultant CCD structure that would provide uniformity of implanted barrier size, and uniformity of potential well size. In addition, it is desirable that this process be compatible with large scale integration processing techniques for MOS circuits.

The importance of extremely accurate processing to yield devices with predictable, reproducible characteristics in charge coupled devices for use in two-phase operation was pointed out in one of the first papers on the subject, an article by Krambeck, Walden and Pickar entitled "Implanted Barrier Two-Phase Charge-Coupled Device" published in *Applied Physics Letters*, Vol. 19, No. 12, pp. 520–522, in 1971.

In Patent Application Ser. No. 429,329, filed Dec. 28, 1973 by M. P. Anthony, et al., entitled "Self Aligned CCD Element Including Fabrication Method Therefor," and assigned in common with the present application, a charge coupled semiconductor device having self-aligned implanted barriers and the process for making such a device is described.

Also, in a patent application Ser. No. 445,361 by G. F. Amelio et al. entitled "Method for Manufacturing a Charge Coupled Device Having Self-Aligned Implanted Barriers with Narrow Gaps Between Electrodes," and assigned in common with the present application, an improved method of manufacturing a CCD is disclosed in which the implanted barrier regions are self-aligned with corresponding edges of the gate electrodes and in which the gaps between the electrodes are relatively narrow.

As pointed out in the above-cited Anthony, et al., copending patent application, efficient CCD operation is hindered when sizable gaps exist between adjacent electrodes. These gaps are wasteful in that they consume material which could be used for other portions of the structure. Also, these gaps are undesirable since they must be passivated during operation.

In U.S. Pat. No. 3,756,924 entitled "Method of Fabricating a Semiconductor Device" by D. R. Collins, et al., a method for forming a structure having adjacent closely spaced electrodes is disclosed. The disclosed structure and method in this patent is distinct from the structure and method disclosed in this application, as will be shown in greater detail hereinbelow.

This invention provides a structure and process for fabricating a CCD in which the barrier regions are intrinsically aligned with corresponding two-phase electrodes which are separated by very narrow gaps, which process is compatible with isoplanar processing. The term "isoplanar," as used herein, refers to the isolation of integrated circuits by means of a first dielectric formed after gate oxidation is carried out in regions defined by a second dielectric layer.

SUMMARY OF THE INVENTION

In accordance with this invention, a self-aligned CCD structure is disclosed which comprises a semiconductor substrate having implanted barrier regions, insulation layers disposed over the semiconductor substrate, a first layer of spaced electrodes, an insulation layer selectively formed over the first layer, a second layer of electrodes selectively disposed between the electrodes of the first layer, and gate contacts formed so as to electrically connect the first layer of electrodes to the second layer of electrodes.

In accordance with another embodiment of this invention, a CCD structure having a self-aligned electrode barrier structure is fabricated. The process of fabrication comprises the steps of forming a first insulating layer over a semiconductor substrate, forming a first conducting layer over the first insulating layer, selectively removing portions of the first conducting layer, forming a second insulating layer over first electrodes comprising the remaining portions of the first conducting layer, implanting barrier regions in the substrate through the openings between the first electrodes, forming second electrodes between the first electrodes by selectively removing portions of a second conducting layer formed over the second insulating layer, forming a third insulating layer over the entire structure, selectively removing portions of the second and third insulating layers in areas above the first electrodes, and selectively forming gate contacts between the first and second electrodes so as to electrically connect the first and second electrodes.

In accordance with another embodiment of the process of this invention, portions of the second insulating layer are selectively removed prior to forming the second electrodes so that ohmic contact is effected directly between the first and second electrodes without the need for the gate contacts.

An important feature of this invention includes providing two polycrystalline silicon layers that are electrically connected together so as to functionally decrease the gaps between the electrodes. The two levels of polycrystalline silicon electrodes, when arranged in array form, advantageously provide a high functional density structure and allows a very dense packing of leads for peripheral circuitry. In this arrangement the first polycrystalline silicon layer forms a first interconnect axis, and the second polycrystalline silicon layer, forms a second interconnect axis orthogonal to the first axis.

IN THE DRAWINGS

FIG. 1 is an elevational cross-sectional view of a semiconductor substrate with a first insulating oxide layer formed on one surface of the substrate, a second insulating nitride layer formed on top of the first insulating layer, and a first polycrystalline silicon layer formed on top of the second insulating layer.

FIG. 2 is a view similar to FIG. 1 with a first photoresist pattern formed on the top surface of the first polycrystalline silicon layer.

FIG. 3 is a view similar to FIG. 2 after portions of the first polycrystalline silicon layer have been etched away in the areas beneath the openings in the first photoresist pattern.

FIG. 4 is a view similar to FIG. 3 after the first photoresist pattern has been removed and after a second layer of silicon dioxide has been formed over the surface of the polycrystalline silicon layer, and after the formed structure has been irradiated with ions so as to implant barrier regions in the semiconductor substrate.

FIG. 5 is a view similar to FIG. 4 with a second polycrystalline layer formed over the second silicon dioxide layer, and a second photoresist pattern is formed over the second polycrystalline silicon layer.

FIG. 6 is a view similar to FIG. 5 after the second polycrystalline silicon layer has been etched and the second photoresist pattern is removed.

FIG. 7 is a view similar to FIG. 6 with a third insulating silicon dioxide layer formed over the structure of FIG. 6, and a third photoresist pattern is formed over the third silicon dioxide layer.

FIG. 8 is a view similar to FIG. 7 after the second and third insulating silicon dioxide layers have been etched away in the areas beneath the openings in the third photoresist pattern.

FIG. 9 is a view similar to FIG. 8 after the third photoresist pattern has been removed, and after a conducting layer has been selectively formed over the structure so as to electrically connect the remaining portions of the first and the second polycrystalline silicon layers.

DETAILED DESCRIPTION

Figure 10:
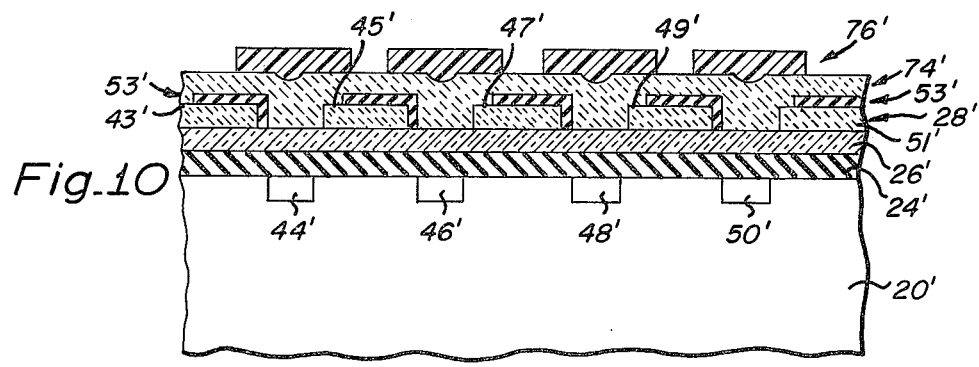
FIGS. 10 through 12 illustrate a structure, and process steps, for another embodiment of this invention; wherein portions of the second silicon dioxide layer are removed to effect an electrical connection between the first and second polycrystalline silicon layers.

Referring to FIG. 1, a semiconductor substrate or wafer 20 is used as the starting material for the fabrication of the final CCD structure of this invention. The substrate 20 is a silicon slice of P type conductivity comprising, for example, a boron doped substrate. Although the described embodiment uses a silicon semiconductor substrate, it is evident to those skilled in the art that other semiconductor materials may be used. Furthermore, the conductivity type regions described in the embodiment shown in the Figures can be of opposite type conductivity, if desired, in order to provide a CCD structure using charge packets with the opposite type of minority carriers.

A first insulating layer 24, which may for example comprise silicon dioxide, is formed on the substrate surface by well known thermal oxidation techniques. In one example, the thermally grown layer 24 has a thickness of 1200 Angstrom units. A second insulating layer 26 is formed on top of the first insulating layer 24. The second insulating layer 26 is, for example, silicon nitride and is formed by well known techniques. In the example where the first insulating layer 24 was 1200 Angstrom units thick, the silicon nitride layer 26 was also 400 Angstrom units thick. The second insulating layer 26 is silicon nitride because thermally grown oxides will not form on the nitride. Thus the silicon nitride is very useful in protecting the underlying layer 24 from becoming significantly thicker as would normally occur during the subsequent oxidation steps in the process of this invention. Additionally, the silicon nitride layer 26 functions as a further protective layer against pinholes in the underlying layer 24. Other materials having characteristics similar to layer 26 may be employed, such as for example aluminum oxide.

Thereafter, a polycrystalline silicon layer 28 is formed on top of the second insulating layer 24. The polycrystalline silicon layer 28 is a doped layer containing impurities (typically phosphorous when layer 28 is doped with a N type impurity) of a sufficient quantity to permit the doped polycrystalline silicon layer 28 to function as an electrical conductor, or gate electrode. In one example, the doped polycrystalline silicon layer 28 has a thickness of about 3,000 to about 4,000 Angstroms.

Referring to FIG. 2, a photoresist layer 32 is deposited by conventional deposition techniques and developed (using photolithographic masking and etching techniques) to define a pattern with openings, of which openings 34, 36, 38, and 40 are shown formed therein. The openings in the photoresist layer 32 are employed subsequently for defining barrier regions that are to be implanted in the substrate 20.

Referring to FIG. 3, portions of the doped polycrystalline silicon layer 28 are removed. Typically this is done by etching with an etchant suitable for use with polycrystalline silicon. For example, a suitable etchant may comprise a solution of hydrofluoric, acetic, and nitric acids; or, a freon gas in a plasma state may be suitable, wherein the plasma etchant mitigates problems of the etchant undercutting the underlying layers. Openings 35, 37, 39, and 41 are formed in the layer 28 as a result of the etching process step, and electrodes 43, 45, 47, 49, and 51 of layer 28 remain after this etching operation.

Referring to FIG. 4, the photoresist pattern layer 32 is removed with the use of conventional photoresist removal solutions. After the photoresist is removed, a thermal oxidation process step is carried out using standard thermal oxidation techniques to form an oxide of the semiconductor material, which in this case is silicon dioxide, on the surface of the polycrystalline silicon layer 28. Accordingly, the oxidation forms a thin oxide layer 53, comprising segments 54, 56, 58, 60, and 62 on the corresponding electrodes 43, 45, 47, 49, and 51 of the first polycrystalline semiconductor layer 28. Moreover, since oxides grow much more slowly on a silicon nitride surface, no substantial oxide grows on the top surface of silicon nitride layer 26.

Thereafter, the next process step is to implant the desired impurity ions in the substrate 20 through the openings 35, 37, 39, and 41 formed in the layer 28. In the preferred embodiment boron ions are implanted so as to form ion-implanted barrier regions 44, 46, 48, and 50 beneath the openings 35, 37, 39, and 41, respectively, in the layer 28. Although boron is the desired P type ion, other P type ions may be used to form the desired type of implanted barrier regions. It can be seen in FIG. 4 that the edges of the implanted barrier regions are vertically aligned with the respective outer edges of the thermally-grown thin oxide layer 53.

The energy, which is imparted to the ions during the irradiation process step, is set at a preferred level to implant the ions at a depth that corresponds with the surface of the substrate 20. In one example, the energy level was set within the range of 100KV to 200KV. The ions will penetrate through the insulation layers 24 and 26, which constitute a thickness of approximately 1600 Angstroms, and will implant in the substrate beneath the openings 35, 37, 39, 41 . . . as shown in FIG. 4. The combined thickness adjacent the electrodes 43, 45, 47, 49, 51 . . . is approximately 6500 Angstroms, which impedes ion penetration. A negligible amount of ions will implant within the polycrystalline silicon layer 28. However, as stated hereinabove, the layer 28 is doped with an impurity, which doping is at a significantly higher concentration than the amount of ions which may implant within the electrodes 43, 45, 47, 49, 51 . . . as a result of the ion irradiation process step.

Referring now to FIG. 5, a second polycrystalline silicon layer 74 is deposited on top of the thermally grown thin oxide layer 53. The second polycrystalline silicon layer 74 is a doped layer containing impurities of a sufficient quantity to permit the doped polycrystalline silicon 74 to function as an electrical conductor or gate electrode. A second photoresist pattern 76 is then formed over the second polycrystalline silicon layer 74.

Referring now to FIG. 6, the second polycrystalline silicon layer 74 is etched by conventional techniques, thereby removing portions of the layer 74 not covered by the second photoresist pattern 76. Layer 74 then comprises second electrodes 84, 86, 88, and 90 which are shown as being T-shaped with a leg portion that extends within the openings 35, 37, 39, and 41 in the first polycrystalline silicon layer 28 and with shoulder portions that extend over the adjacent oxide layers of layer 53; thereby forming flange portions above the adjacent first polycrystalline silicon electrodes 43, 45, 47, 49, 51 . . . The width of the leg portions of the second electrodes is substantially equal to the width of the barriers 44, 46, 48, 50 . . .

Referring now to FIG. 7, another thermal oxidation process step is carried out using standard thermal oxidation techniques to form an oxide of the semiconductor material, similar to the oxide layer 53, which in this case is silicon dioxide, on the surface of the structure of FIG. 6. The oxide thus formed is designated as layer 93 and covers layer 53 above portions of the first polycrystalline silicon layer 28, and portions of the second polycrystalline layer 74. A photoresist pattern 95 is deposited over the oxide layer 93, and formed into the pattern illustrated in the cross section of FIG. 7. The openings in the photoresist pattern 95 extend substantially over the center of respective electrodes 43, 45, 47, 49, and 51 of the first polycrystalline silicon layer 28.

Referring to FIG. 8, an oxide etching operation is carried out to remove those portions of oxide layers 53 and 93 located within the openings in the photoresist layer 95. As a result of this selective removal of the oxide layers, the center portion of the top surface of each of the electrodes 45, 47, 49, and 51 of the first polycrystalline silicon layer 28 and the right edge of the T-shaped electrodes 84, 86, 88, and 90 of the second polycrystalline silicon layer 74 are exposed. The terms "left" and "right" as used herein are intended to apply only to positions in the drawings when viewed in a conventional manner.

Referring to FIG. 9, the photoresist pattern layer is removed using conventional photoresist removal solutions. After the photoresist is removed, a conducting layer 100 is formed over the entire structure and within the openings formed by the previous etching step so as to electrically connect the electrodes of the first polycrystalline silicon layer 28 with adjacent electrodes of the second polycrystalline silicon layer 74.

After the formation of the conducting layer 100, the desired gate interconnection pattern is formed by a metal etching operation which etches out a defined pattern so as to provide gate contacts, such as contacts 101, 102, 103, and 104, of the final structure shown in FIG. 9. This may be done by the use of another photoresist pattern (not shown), and a suitable etchant.

The final structure illustrated in FIG. 9 comprises a plurality of closely spaced CCD gates, with self-aligned implanted barriers. In particular, electrodes 45, 47, 49, and 51 of layer 28 are in ohmic contact with electrodes 84, 86, 88, and 90 of layer 74 by means of gate contacts 101, 102, 103, and 104, respectively. The lateral extremities of each CCD gate are illustrated graphically in FIG. 9 by means of brackets 106, 107, 108, and 109. For example bracket 106 demarcates the lateral extremities of a gate comprising electrode 84 of layer 74, electrode 45 of layer 28, and gate contact 101. Implanted barrier 44 is aligned with the left edge of the gate demarcated by bracket 106.

The final CCD structure shown in the FIG. 9 is a two-phase, ion-implanted barrier CCD arrangement wherein self-alignment is achieved between the ion-implanted barrier regions and the respective two layers of doped polycrystalline silicon gate electrodes associated therewith. As established in the CCD art, the gate electrodes serve to electrically lower the potential in the barrier regions in a selective manner to permit charge packets to be transmitted unidirectionally in shift-register function along the surface of the CCD structure.

Accordingly, the CCD structure formed by the process has truly self-aligned barrier regions that are not dependent upon any critical etching techniques. As can be seen with reference to the drawings, the implanted barrier regions 44, 46, 48, and 50 are aligned with the sides of the oxide layer 53. Thus, self-alignment is precisely achieved. In addition, the ion-implantation step in this process can be achieved with a relatively low-power 100kv to 200kv implanting device since the ions forming the barrier regions are implanted through only relatively thin insulating layers and not through the relatively thick polycrystalline silicon layers. These advantages outweigh the fact that a double polycrystalline silicon technology is required to form the two electrode layers.

To improve the performance of the device of the present invention, buried channel construction may be employed. A buried channel is obtained typically by forming a layer of appropriate impurities (n type impurities for an n channel device, and p type impurities for a p channel device) in the semiconductor substrate near the substrate-insulator interface. Typically, this layer is formed using ion implantation techniques. Such a buried channel is not illustrated in the figures; however, a buried channel, if employed, would be implanted within the substrate 20 prior to the formation of the first polycrystalline silicon layer 28.

The process described above may be modified to fabricate a structure similarly having closely spaced electrodes. In the description hereinafter of other embodiments of this invention, like reference numerals are employed in FIGS. 10 through 12 with a single prime, and in FIG. 13 with a double prime.

Referring now to FIG. 10, a modification of the process is illustrated, which modification is made after the process step illustrated in FIG. 4. Portions of the insulation layer 53' are removed from the left side of the electrodes 43', 45', 47', 49', and 51'. Such a removal process step may be accomplished by the use of a photoresist layer (not shown) and a suitable etchant.

The polycrystalline silicon layer 74' is formed over the structure in the same manner as described above in conjunction with the description of FIG. 5. A photoresist pattern layer 76' is formed over the polycrystalline silicon layer 74' to define the pattern of the second layer of electrodes.

Figure 11:
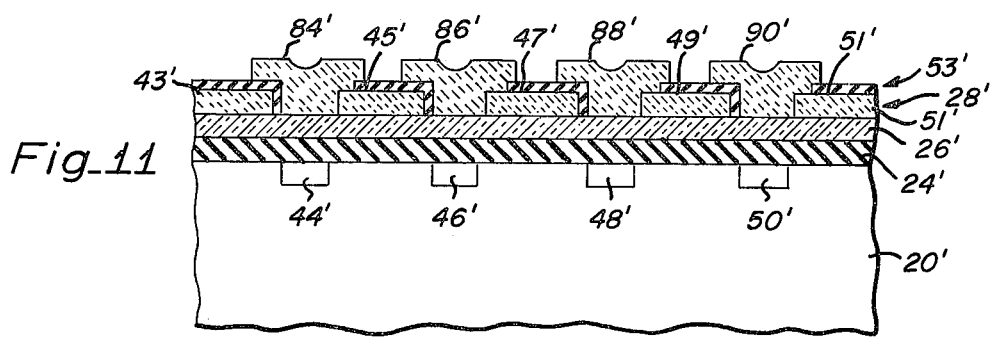

Referring now to FIG. 11, the polycrystalline silicon layer 74' is etched by conventional techniques, which forms electrodes 84', 86', 88', and 90'. The removal of portions of the oxide layer 53' from the first electrodes 43', 45', 47', 49', and 51' allows the formation of electrical connections between adjacent ones of the first and second electrodes. That is, electrode 84 is in ohmic contact with electrode 45, electrode 86 is in ohmic contact with electrode 47, and so forth for the remaining electrodes.

Figure 12:
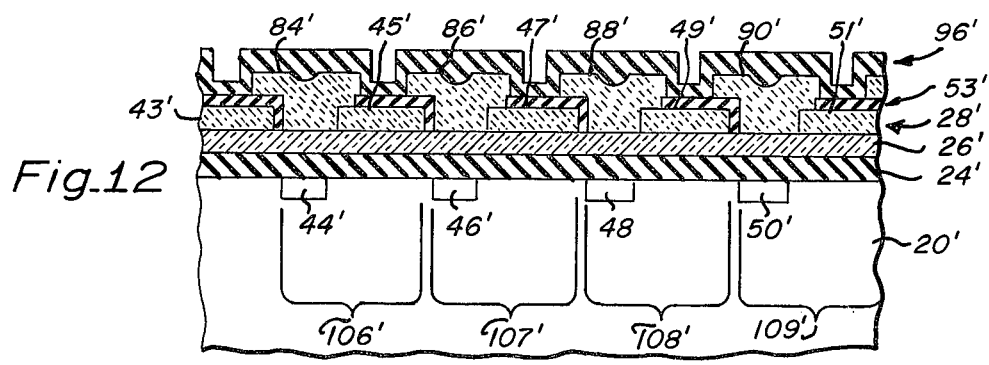

Referring now to FIG. 12, an insulation layer 96' is formed over the entire structure. Connections to the underlying electrodes may be effected by means of via holes, which technique is well known in the art. The final structure of another embodiment of this invention, as illustrated in FIG. 12, comprises a plurality of closely spaced CCD gates with self-implanted barriers. The lateral extremities of each CCD gate are illustrated graphically in FIG. 12 by means of brackets 106', 107', 108', and 109'. For example, bracket 106' demarcates a CCD gate comprising first electrode 45' and second electrode 84', which are in ohmic contact with one another at the left edge of electrode 45'. Also, implanted barrier 44' is in alignment with the left edge of electrode 84' and comprises a portion of the CCD gate demarcated by bracket 106'. The CCD gate demarcated by bracket 107' is separated from the formerly described gate demarcated by bracket 106' by the thickness of the oxide layer on the right hand portion of the electrode 45'. The remaining CCD gates throughout the structure of this invention are fabricated in a similar manner.

Figure 13:
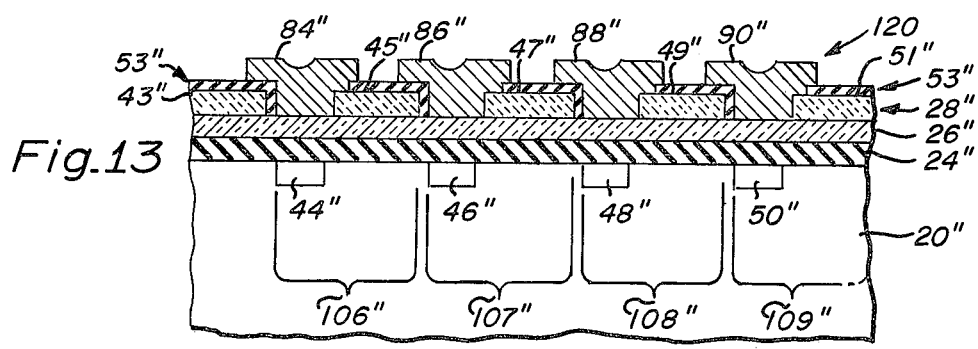
FIG. 13 illustrates still another embodiment of this invention, wherein a metallic conductor is substituted in lieu of the second polycrystalline silicon layer.

Referring now to FIG. 13, still another embodiment of this invention is illustrated. A portion of the oxide layer 53'' is removed from the electrodes 43'', 45'', 47'', and 51'' (of the structure illustrated in FIG. 4), and a second layer of electrodes is formed from an aluminum conductor 120. The aluminum conductor 120 is formed into individual electrodes by the use of a photoresist pattern (not shown) and a suitable etchant.

The final structure illustrated in FIG. 13 differs primarily from the structure illustrated in FIG. 12 by the use of metallic material for the second electrodes.

What is claimed is:

1. A process for fabricating a charge coupled device structure in a semiconductor substrate, comprising the steps of
   selectively applying at least one layer of insulation material to said semiconductor substrate;
   selectively forming a plurality of spaced-apart first gate electrodes on the uppermost surface of said at least one layer of insulation material;
   forming a first insulation layer over said plurality of first gate electrodes;
   forming implanted barrier regions in said semiconductor substrate in the intervals between said plurality of spaced-apart first gate electrodes, the edges of said implanted barrier regions being aligned with the vertical edges of the insulation layer on the respective first gate electrodes;
   selectively forming a plurality of second gate electrodes on said uppermost surface of said at least one insulating layer between said plurality of spaced-apart first gate electrodes, each of said second gate electrodes substantially occupying the space between adjacent first gate electrode; and
   connecting each of said second gate electrodes to an individual adjacent first gate electrode to form a composite electrode for a charge coupled element.

2. The process as recited in claim 1 wherein the step of forming implanted barrier regions is accomplished by implanting ions of a conductivity type opposite to the conductivity type of said semiconductor substrate in said substrate in said intervals.

3. The process as recited in claim 2 wherein the connecting step comprises forming an ohmic contact between each of said plurality of first gate electrodes and an adjacent second gate electrode.

4. The process as recited in claim 3 wherein said step of forming an ohmic contact comprises the steps of
   forming a second insulation layer over said first insulation layer and said second gate electrodes;
   selectively removing portions of said first and second insulation layers; and
   forming a conductive interconnection between each of said first gate electrodes and said adjacent second gate electrodes.

5. The process as recited in claim 4 wherein the steps of selectively forming said plurality of spaced-apart first gate electrodes and selectively forming said plurality of second gate electrodes are accomplished by depositing doped polycrystalline silicon and removing selected portions of said doped polycrystalline silicon.

6. The process as recited in claim 5 wherein said step of applying at least one layer of insulation material is accomplished by
    forming a layer of silicon dioxide on said semiconductor substrate; and
    forming a layer of silicon nitride on said layer of silicon dioxide.

7. The process as recited in claim 6 wherein said step of forming a layer of silicon dioxide is accomplished by thermally oxidizing said semiconductor substrate.

8. The process as recited in claim 7 further including before said step of forming at least one layer of insulation material the step of forming a buried channel region in the surface of said semiconductor substrate.

9. The process as recited in claim 3 further comprising forming an ohmic contact between each of said plurality of first gate electrodes and an adjacent second gate electrode by
    selectively removing portions of said first insulation layer prior to the step of forming said second gate electrodes; and
    forming said plurality of second gate electrodes so that one of said second gate electrodes contacts and forms an electrical communication with the exposed portion of an adjacent one of said first gate electrodes.

* * * * *